(12) United States Patent
Chen et al.

(10) Patent No.: US 12,550,774 B2
(45) Date of Patent: Feb. 10, 2026

(54) CARRIER PLATE FOR PREPARING PACKAGE SUBSTRATE, PACKAGE SUBSTRATE STRUCTURE AND MANUFACTURING METHOD THEREOF

(71) Applicant: Zhuhai ACCESS Semiconductor Co., Ltd, Guangdong (CN)

(72) Inventors: Xianming Chen, Guangdong (CN); Jindong Feng, Guangdong (CN); Benxia Huang, Guangdong (CN); Gao Huang, Guangdong (CN); Juchen Huang, Guangdong (CN)

(73) Assignee: Zhuhai ACCESS Semiconductor Co., Ltd, Guangdong (CN)

( * ) Notice: Subject to any disclaimer, the term of this patent is extended or adjusted under 35 U.S.C. 154(b) by 474 days.

(21) Appl. No.: 18/115,043

(22) Filed: Feb. 28, 2023

(65) Prior Publication Data

US 2023/0282490 A1   Sep. 7, 2023

(30) Foreign Application Priority Data

Mar. 1, 2022   (CN) .......................... 202210206314.1

(51) Int. Cl.
| | | |
|---|---|---|
| *H01L 21/56* | (2006.01) | |
| *H01L 21/683* | (2006.01) | |
| *H01L 23/00* | (2006.01) | |
| *H01L 23/498* | (2006.01) | |

(52) U.S. Cl.
CPC ........ *H01L 21/568* (2013.01); *H01L 21/6835* (2013.01); *H01L 23/49838* (2013.01); *H01L 24/19* (2013.01); *H01L 2224/19* (2013.01)

(58) Field of Classification Search
CPC ............... H01L 21/568; H01L 21/6835; H01L 23/49838; H01L 24/19; H01L 2224/19; H01L 23/49816; H01L 23/49827; H01L 21/4857; H01L 21/486; H01L 23/49822; H01L 23/49811; H01L 21/4846; H01L 23/49866
USPC ......................................................... 257/737
See application file for complete search history.

(56) References Cited

U.S. PATENT DOCUMENTS

| | | | | | |
|---|---|---|---|---|---|
| 4,840,923 | A * | 6/1989 | Flagello | ............... | H05K 3/0041 257/E21.575 |
| 5,227,013 | A * | 7/1993 | Kumar | ................... | H01L 21/486 219/121.85 |
| 10,157,824 | B2 * | 12/2018 | Kang | ................... | H01L 23/5384 |
| 10,903,151 | B2 * | 1/2021 | Lu | ..................... | H01L 23/49838 |
| 11,817,437 | B2 * | 11/2023 | Lin | ................... | H01L 23/49838 |
| 12,191,236 | B2 * | 1/2025 | Hwang | ............. | H01L 23/49816 |
| 2015/0249209 | A1 * | 9/2015 | Lu | .......................... | H10N 50/80 257/421 |
| 2022/0399297 | A1 * | 12/2022 | Nakabayashi | .......... | H01L 24/16 |
| 2023/0154857 | A1 * | 5/2023 | Chen | ................... | H01L 23/3736 257/690 |

* cited by examiner

*Primary Examiner* — Vu A Vu
(74) *Attorney, Agent, or Firm* — The PL Law Group, PLLC

(57) ABSTRACT

A carrier plate for preparing a package substrate according to an embodiment includes a dielectric layer, a seed layer in the dielectric layer, and a copper pillar layer on the seed layer. A bottom end of the seed layer is higher than a lower surface of the dielectric layer. A top end of the copper pillar layer is lower than an upper surface of the dielectric layer. The upper and lower surfaces of the dielectric layer are respectively provided with a first metal layer and a second metal layer.

11 Claims, 9 Drawing Sheets

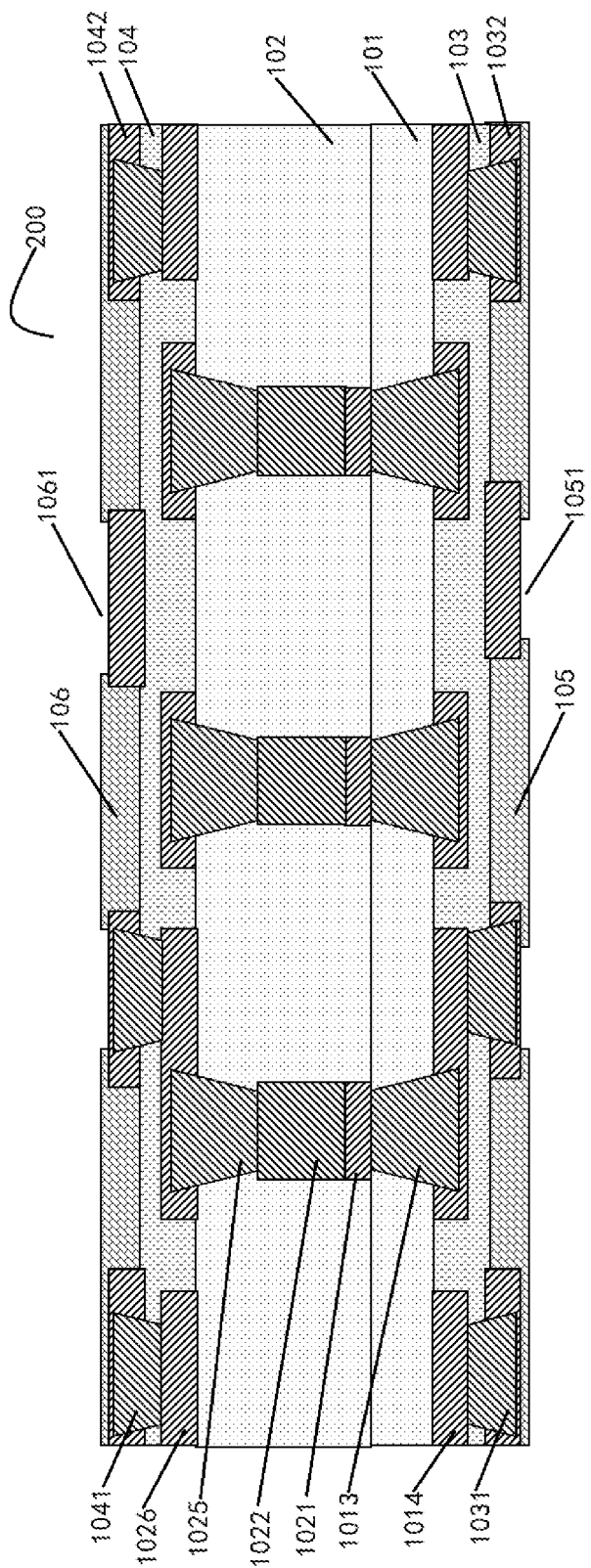
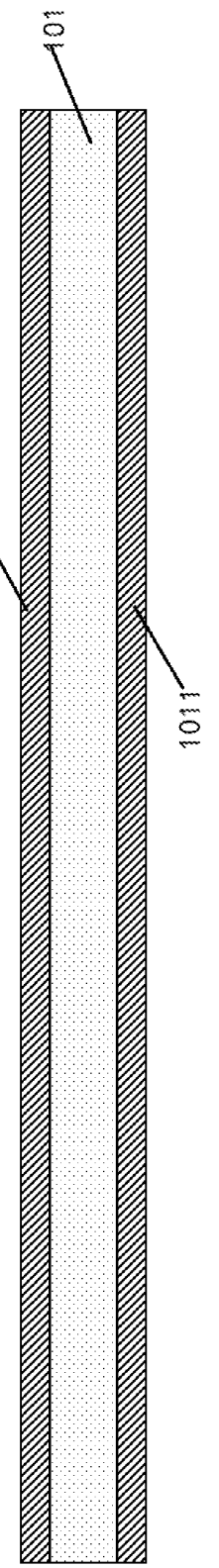
FIG. 3
FIG. 4A

CARRIER PLATE FOR PREPARING PACKAGE SUBSTRATE, PACKAGE SUBSTRATE STRUCTURE AND MANUFACTURING METHOD THEREOF

CROSS-REFERENCE TO RELATED APPLICATIONS AND CLAIM OF PRIORITY

This application claims the benefit under 35 USC § 119 of Chinese Patent Application No. 202210206314.1, filed on Mar. 1, 2022, in the China Intellectual Property Office, the entire disclosure of which is incorporated herein by reference for all purposes.

BACKGROUND

1. Technical Field

The present invention relates to the field of semiconductor packaging, and in particular to a carrier plate for preparing a package substrate, a package substrate structure and a manufacturing method thereof.

2. Background Art

In the prior art, a solid copper pillar in a core layer is fabricated by using a mechanical blind drilling followed by porefilling and electroplating. However, residual stubs may exist at the bottom of the prepared mechanical blind hole, which affects the fabrication of the copper pillar, resulting in poor connection and conduction between layers.

In addition, the mechanical blind hole has a large aspect ratio. The copper pillar obtained after porefilling and electroplating has poor quality.

SUMMARY

Embodiments of the present invention provide a carrier plate for preparing a package substrate, a package substrate structure and a manufacturing method thereof.

In a first aspect, the present invention relates to a carrier plate for preparing a package substrate, comprising a dielectric layer, a seed layer in the dielectric layer, and a copper pillar layer on the seed layer, wherein a bottom end of the seed layer is higher than a lower surface of the dielectric layer; a top end of the copper pillar layer is lower than an upper surface of the dielectric layer; and the upper and lower surfaces of the dielectric layer are respectively provided with a first metal layer and a second metal layer.

In some embodiments, the dielectric layer comprises a first dielectric layer and a second dielectric layer arranged in a longitudinal direction; an upper surface of the first dielectric layer and a lower surface of the second dielectric layer are adhered; the seed layer and the copper pillar layer on the seed layer are provided in the second dielectric layer; a lower surface of the seed layer is flush with a lower surface of the second dielectric layer; the top end of the copper pillar layer is lower than an upper surface of the second dielectric layer; the first metal layer is provided on a lower surface of the first dielectric layer; and the second metal layer is provided on the upper surface of the second dielectric layer.

In some embodiments, a first via hole exposing the seed layer is provided in the first dielectric layer, the first via hole penetrating through the first metal layer; and a second via hole exposing the top end of the copper pillar layer is provided in the second dielectric layer, the second via hole penetrating through the second metal layer.

In some embodiments, the first metal layer has a same or similar thicknesses with that of the second metal layer.

In a second aspect, the present invention provides a package substrate structure, comprising a first dielectric layer and a second dielectric layer arranged along a longitudinal direction, wherein an upper surface of the first dielectric layer and a lower surface of the second dielectric layer dielectric layer are adhered; a seed layer, a copper pillar layer on the seed layer and a second conductive pillar layer on the copper pillar layer are provided in the second dielectric layer; the lower surface of the seed layer is flush with the lower surface of the second dielectric layer; a first conductive pillar layer is provided in the first dielectric layer, the first conductive pillar layer being in communication with the seed layer; a first line layer is provided on the lower surface of the first dielectric layer; a second line layer is provided on an upper surface of the second dielectric layer; and the first line layer and the second line layer are conductively connected by the first conductive pillar layer, the copper pillar layer and the second conductive pillar layer.

In some embodiments, the first dielectric layer and the second dielectric layer are same or different.

In some embodiments, the copper pillar layer comprises at least one copper pillar.

In some embodiments, the invention further comprises a third dielectric layer on the first line layer and a fourth dielectric layer on the second line layer, wherein a third conductive pillar layer is provided in the third dielectric layer; a third line layer is provided on a lower surface of the third dielectric layer; the first line layer and the third line layer are conductively connected by the third conductive pillar layer; a fourth conductive pillar layer is provided in the fourth dielectric layer; a fourth line layer is provided on an upper surface of the fourth dielectric layer; and the second line layer and the fourth line layer are conductively connected by the fourth conductive pillar layer.

In some embodiments, the conductive pillar layer comprises at least one conductive pillar.

In some embodiments, the invention further comprises a first solder mask layer outside the third line layer and a second solder mask layer outside the fourth line layer; and a first solder mask opening window and a second solder mask opening window are provided in the first solder mask layer and the second solder mask layer, respectively.

In a third aspect of the invention, the invention provides a manufacturing method for a package substrate structure, comprising the steps of:
(a) preparing a first dielectric layer, and respectively forming a first metal layer on upper and lower surfaces of the first dielectric layer;
(b) preparing a copper pillar layer on the first metal layer on the upper surface of the first dielectric layer, and etching the first metal layer exposed on the upper surface of the first dielectric layer to form a seed layer;
(c) forming a second dielectric layer on the copper pillar layer, adhering a lower surface of the second dielectric layer and an upper surface of the first dielectric layer, a top end of the copper pillar layer being lower than an upper surface of the second dielectric layer;
(d) forming a second metal layer on the upper surface of the second dielectric layer;
(e) forming a first via hole exposing the seed layer in the first dielectric layer, the first via hole penetrating through the first metal layer; forming a second via hole exposing the top end of the copper pillar layer in the second dielectric layer, the second via hole penetrating through the second metal layer; forming by the seed layer a bottom end of the copper pillar layer; and respectively exposing by the second via hole and the first via hole the top end and the bottom end of the copper pillar layer.

In some embodiments, the method further comprises:

(f) after step (e), electroplating the first via hole to form a first conductive pillar layer; and electroplating the second via hole to form a second conductive pillar layer, wherein the first metal layer on the lower surface of the first dielectric layer and the second metal layer are conductively connected by the first conductive pillar layer, the copper pillar layer and the second conductive pillar layer.

In some embodiments, the method further comprises:

(g) after step (f), processing the first metal layer to form a first line layer; and processing the second metal layer to form a second line layer, wherein the first line layer and the second line layer are conductively connected by the first conductive pillar layer, the copper pillar layer and the second conductive pillar layer.

In some embodiments, the method further comprises:

(h) after step (g), forming a third dielectric layer on the first line layer and a fourth dielectric layer on the second line layer;

(i) forming a third metal layer on the third dielectric layer and a fourth metal layer on the fourth dielectric layer;

(j) forming a third conductive pillar layer in the third dielectric layer, and forming a fourth conductive pillar layer in the fourth dielectric layer, wherein the first line layer and the third metal layer are conductively connected by the third conductive pillar layer; and the second line layer and the fourth metal layer are conductively connected by the fourth conductive pillar layer;

(k) processing the third metal layer to form a third line layer, and processing the fourth metal layer to form a fourth line layer, wherein the first line layer and the third line layer are conductively connected by the third conductive pillar layer, and the second line layer and the fourth line layer are conductively connected by the fourth conductive pillar layer;

(l) forming a first solder mask layer outside the third line layer; forming a second solder mask layer outside the fourth line layer; and forming a first solder mask opening window and a second solder mask opening window respectively in the first solder mask layer and the second solder mask layer.

It can be seen from the above that the present invention provides a carrier plate for preparing a package substrate, a package substrate structure and a manufacturing method thereof. A copper pillar layer is prepared in a dielectric layer in advance, and an upper conductive pillar and a lower conductive pillar which are respectively in communication with the copper pillar layer are prepared, so that the longitudinal height of the conductive pillar is shortened, the aperture aspect ratio of the conductive pillar is reduced, and the quality of the conductive pillar obtained after porefilling and electroplating is improved. Thus, the prepared conductive pillar and copper pillar have good electrical properties and superior reliability performance. In addition, the manufacturing method for the package substrate structure can be applied to a thick core plate. The warpage rate of the substrate can be reduced. The via hole contacting the circuit can be made smaller, so that the fine circuit design requirements of the core layer can be realized, and the yield rate can be improved.

BRIEF DESCRIPTION OF THE DRAWINGS

For a better understanding of the present invention and to show embodiments thereof, reference will now be made, purely by way of example, to the accompanying drawings.

With specific reference now to the drawings in detail, it is stressed that the specific diagrams are given by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention. The description taken with the drawings makes apparent to those skilled in the art how the several forms of the present invention may be embodied in practice. In the drawings.

FIG. 3 is a schematic cross-sectional view of a package substrate structure 200 according to an embodiment of the present invention;

FIGS. 4A-4J show schematic cross-sectional views of intermediate structures at various steps of a manufacturing method for a package substrate structure 200 according to an embodiment of the present invention.

DETAILED DESCRIPTION OF THE EMBODIMENTS

With the development and progress of electronic technology, electronic products evolve in the direction of being short, light and thin, which promotes the packaging structure of electronic products to develop in the direction of high integration and miniaturization, thus making electronic components and circuit board substrate lines more and more integrated, miniaturized and multifunctional. Further, it causes an increase in the number of layers of the substrate as a component carrier and a smaller line width, line spacing and via hole/pillar. Meanwhile, the transmission of high-frequency signals and the requirements for the integrity of the transmitted signal have higher and higher requirements for the conduction between layers. The solid copper pillars used between layers has good electrical performance and superior reliability.

Figure 1:
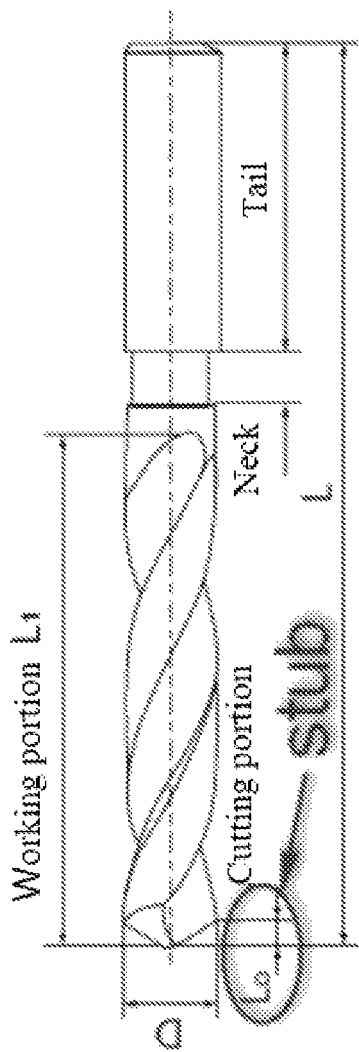
FIG. 1 is a schematic view showing the structure of a mechanical drill according to the prior art.

In the prior art, a solid copper pillar in a core layer is fabricated by using a mechanical blind drilling followed by porefilling and electroplating. The structure of the mechanical drill is as shown in FIG. 1. Since the drill tip of the mechanical drill has a drill point angle, stubs will exist at the bottom of the mechanical blind hole formed after the blind drilling, affecting the fabrication of the copper pillar, resulting in poor connection and conduction between layers. The length of the stub is the length of the working portion of the mechanical drill minus the length of the cutting portion. In addition, due to the large aspect ratio of the aperture of the mechanical blind hole, the copper pillar obtained after the porefilling and electroplating has poor quality.

In order to solve the problem, the present invention provides a carrier plate for preparing a package substrate, including a dielectric layer, a seed layer in the dielectric layer and a copper pillar layer on the seed layer. A bottom end of the seed layer is higher than a lower surface of the dielectric layer. A top end of the copper pillar layer is lower than an upper surface of the dielectric layer. A first metal layer is provided on the lower surface of the dielectric layer, and a second metal layer is provided on the upper surface of the dielectric layer.

In the present invention, a copper pillar layer is prepared in a dielectric layer in advance, and an upper conductive pillar and a lower conductive pillar which are respectively in communication with the copper pillar layer are prepared, so that the longitudinal height of the conductive pillar is shortened, the aperture aspect ratio of the conductive pillar is reduced, and the quality of the conductive pillar obtained after porefilling and electroplating is improved. Thus, the prepared conductive pillar and copper pillar have good electrical properties and superior reliability performance.

Figure 2:
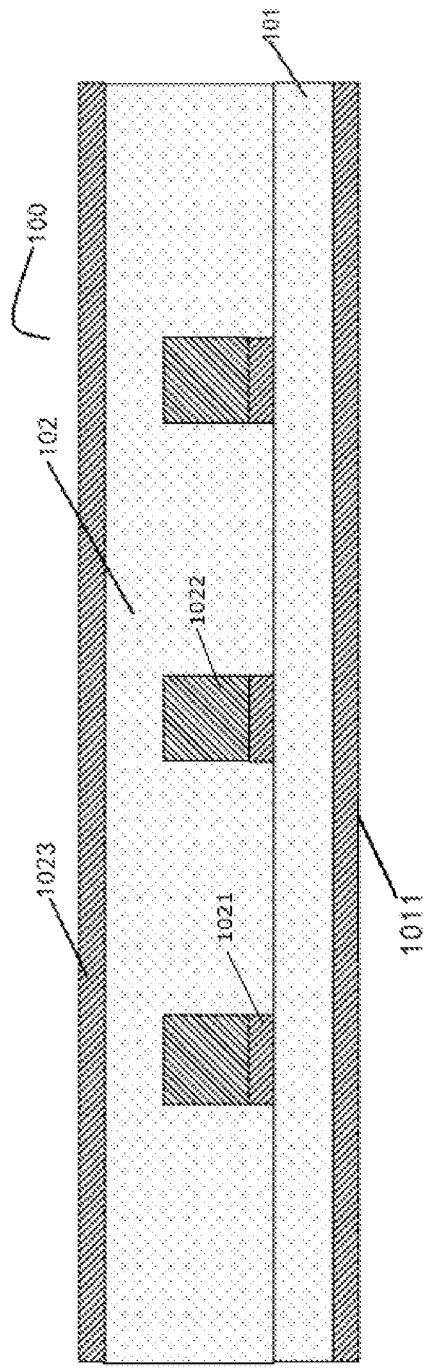
FIG. 2 is a schematic cross-sectional view of a carrier plate 100 for preparing a package substrate according to an embodiment of the present invention.

Referring to FIG. 2, it shows a schematic cross-sectional view of a carrier plate 100 for preparing a package substrate. The carrier plate 100 includes a first dielectric layer 101 and a second dielectric layer 102 arranged in a longitudinal direction. The first dielectric layer 101 and the second dielectric layer 102 together constitute the dielectric layer of the carrier plate 100.

The upper surface of the first dielectric layer 101 is adhered to the lower surface of the second dielectric layer 102. A seed layer 1021 is provided in the second dielectric layer 102. A copper pillar layer 1022 is provided on the seed layer 1021. A lower surface of the seed layer 1021 is flush with a lower surface of the second dielectric layer 102. The top end of the copper pillar layer 1022 is lower than an upper surface of the second dielectric layer 102. A first metal layer 1011 is provided on the lower surface of the first dielectric layer 101. A second metal layer 1023 is provided on the upper surface of the second dielectric layer 102.

In general, the copper pillar layer 1022 may include a plurality of copper pillars, which may have same or different cross-sectional dimensions. Preferably, the copper pillar layer 1022 is uniform in size from top to bottom, which is advantageous for heat dissipation and signal transmission stability of the embedded package structure.

Generally, a first via hole 1012 exposing the seed layer 1021 may be provided in the first dielectric layer 101, the first via hole 1012 penetrating through the first metal layer 1011. A second via hole 1024 exposing the top end of the copper pillar layer 1022 may be provided in the second dielectric layer 102, the second via hole 1024 penetrating through the second metal layer 1023.

Alternatively, the first metal layer 1011 may have a same or similar thicknesses with that of the second metal layer 1023.

Referring to FIG. 3, it shows a schematic cross-sectional view of a package substrate structure 200. The package substrate structure 200 includes a first dielectric layer 101 and a second dielectric layer 102 arranged in a longitudinal direction. An upper surface of the first dielectric layer 101 and a lower surface of the second dielectric layer 102 are adhered.

A seed layer 1021 is provided in the second dielectric layer 102. A copper pillar layer 1022 is provided on the seed layer 1021. A second conductive pillar layer 1025 is provided on the copper pillar layer 1022. The lower surface of the seed layer 1021 is flush with the lower surface of the second dielectric layer 102.

A first conductive pillar layer 1013 is provided in the first dielectric layer 101. The first conductive pillar layer 1013 is in communication with the seed layer 1021. A first line layer 1014 is provided on the lower surface of the first dielectric layer 101. A second line layer 1026 is provided on the upper surface of the second dielectric layer 102. The first line layer 1014 and the second line layer 1026 are conductively connected by the first conductive pillar layer 1013, the copper pillar layer 1022 and the second conductive pillar layer 1025. The first conductive pillar layer 1013, the copper pillar layer 1022 and the second conductive pillar layer 1025 are connected with the first line layer 1014 and the second line layer 1026 in a conductive manner, instead of conducting the line layer by using a single conductive pillar, which can effectively shorten the longitudinal height of the conductive pillar, reduce the aperture aspect ratio of the conductive pillar and improve the quality of the conductive pillar.

Alternatively, the first dielectric layer 101 and the second dielectric layer 102 may be same or different.

Typically, the copper pillar layer 1022 includes at least one copper pillar. Preferably, the copper pillar layer 1022 includes a plurality of copper pillars, which may have same or different cross-sectional dimensions. The copper pillar layer 1022 is uniform in size from top to bottom, which is advantageous for heat dissipation and signal transmission stability of the embedded package structure.

Referring to FIG. 3, the package substrate structure 200 further includes a third dielectric layer 103 on the first line layer 1014. The third dielectric layer 103 is provided with a third the third dielectric layer 103. A third line layer 1032 is provided on a lower surface of the third dielectric layer. The first line layer 1014 and the third line layer 1032 are conductively connected by the third conductive pillar layer 1031.

A fourth dielectric layer 104 is further provided on the second line layer 1026. A fourth conductive pillar layer 1041 is provided in the fourth dielectric layer 104. A fourth line layer 1042 is provided on the upper surface of the fourth dielectric layer 104. The second line layer 1026 and the fourth line layer 1042 are conductively connected by the fourth conductive pillar layer 1041.

In general, the conductive pillar layer may include at least one conductive pillar. Preferably, the conductive pillar layer includes a plurality of conductive copper pillars, which may or may not have same cross-sectional dimensions.

Referring to FIG. 3, the package substrate structure 200 further includes a first solder mask layer 105 outside the third line layer 1032. A first solder mask opening window 1051 is provided in the first solder mask layer 105. A second solder mask layer 106 is provided outside the fourth line layer 1042. A second solder mask opening window 1061 is provided inside the second solder mask layer 106.

Referring to FIGS. 4A-4J, cross-sectional schematic views of intermediate structures at various steps of a method for manufacturing a package substrate structure according to an embodiment of the present invention are shown.

The manufacturing method includes the following steps. A first dielectric layer 101 is prepared. A first metal layer 1011 is formed on the upper and lower surfaces of the first dielectric layer 101, respectively, in step (a), as shown in FIG. 4A.

Generally, the dielectric layer may be formed by laminating a dielectric material, which may be selected from PP, ABF or PID, preferably PP. The first metal layer 1011 may be formed by applying a copper foil on the upper and lower surfaces of the first dielectric layer 101, respectively, which is not specially limited. It is preferable that the first metal layer 1011 includes copper.

Then, a first photoresist layer is applied on the first metal layer 1011 on the upper surface of the first dielectric layer 101, exposing and developing to form a first feature pattern.

Figure 4B:
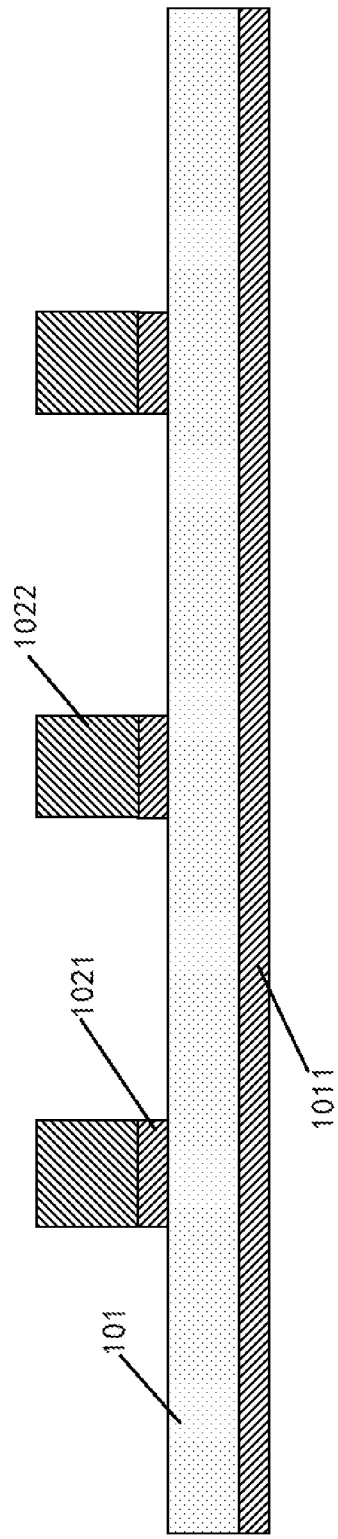

A copper pillar layer 1022 is formed by plating copper in the first feature pattern. The first photoresist layer is removed. A seed layer 1021 is formed by etching the exposed first metal layer 1011 on the upper surface of the first dielectric layer 101. The seed layer 1021 is equivalent to the bottom end of the copper pillar layer 1022, step (b), as shown in FIG. 4B.

Figure 4C:
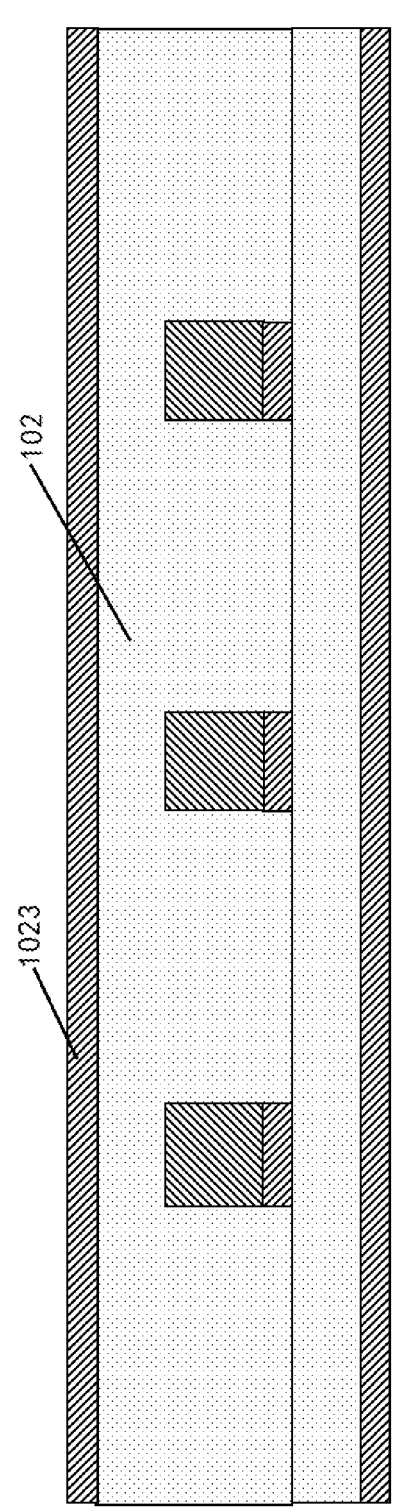

Then, a second dielectric layer 102 is formed on the copper pillar layer 1022. A lower surface of the second dielectric layer 102 is adhered to the upper surface of the first dielectric layer 101. A top end of the copper pillar layer 1022 is lower than an upper surface of the second dielectric layer 102. A second metal layer 1023 is formed on the upper surface of the second dielectric layer 102, step (c), as shown in FIG. 4C.

The top end of the copper pillar layer 1022 is much lower than the upper surface of the second dielectric layer 102, which reduces copper pillar damage due to lamination of the dielectric layers.

Generally, the second metal layer 1023 may be formed by applying a copper foil, without limitation.

Figure 4D:
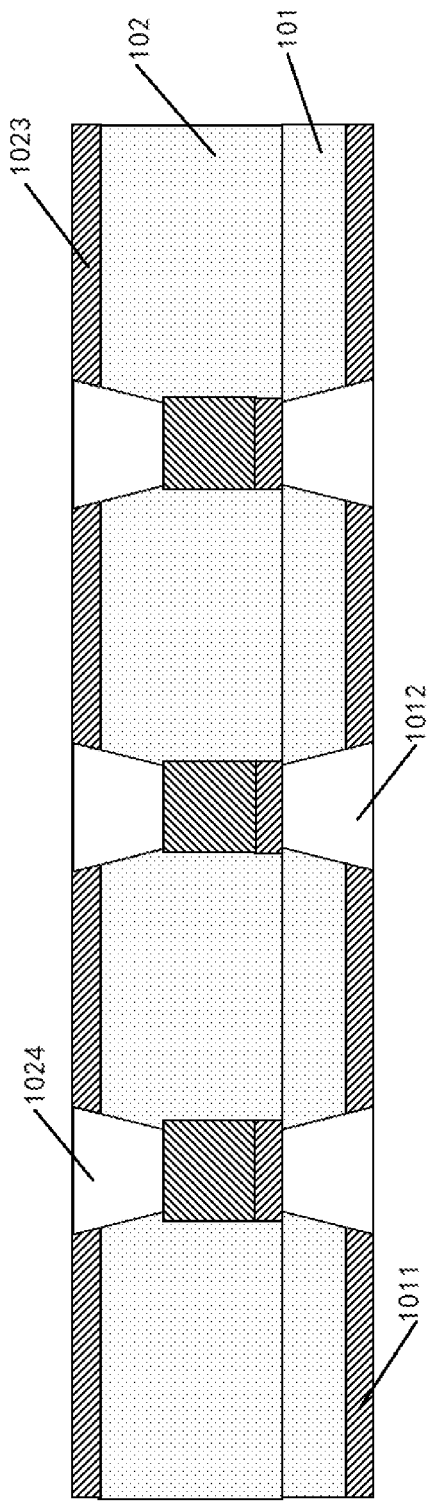

Next, a first via hole 1012 exposing the seed layer 1021 is formed in the first dielectric layer 101, the first via hole 1012 penetrating through the first metal layer 1011. A second via hole 1024 exposing the top end of the copper pillar layer 1022 is formed in the second dielectric layer 102, and the second via hole 1024 penetrating through the second metal layer 1023. The second via hole 1024 and the first via hole 1012 respectively exposes the top end and the bottom end of the copper pillar layer 1022, step (d), as shown in FIG. 4D.

Typically, the via hole may be formed by laser drilling.

Figure 4E:
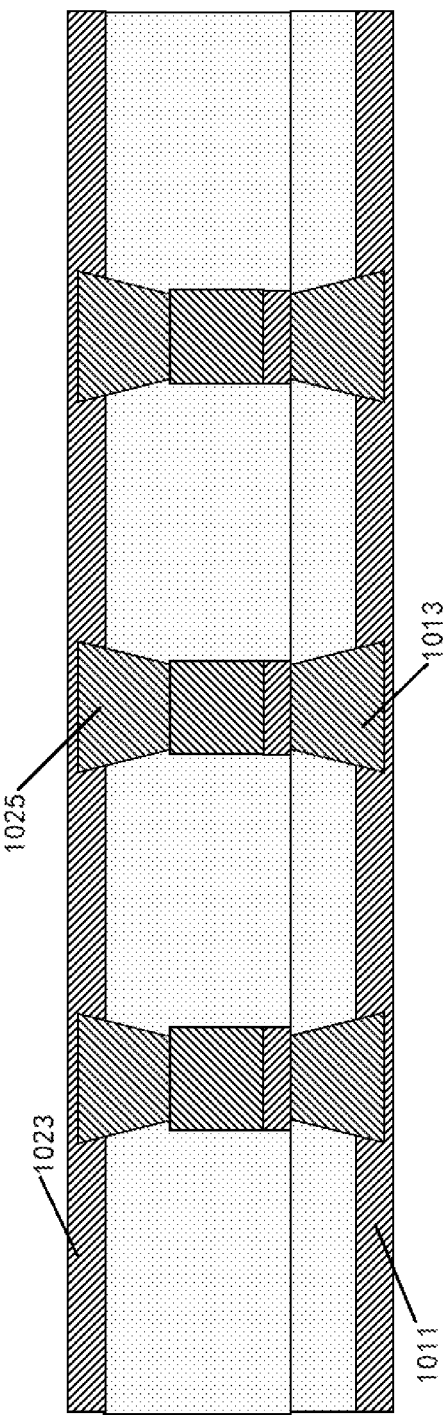

Then, the first via hole 1012 is plated to form a first conductive pillar layer 1013. The second via hole 1024 is plated to form a second conductive pillar layer 1025. The first metal layer 1011 on the lower surface of the first dielectric layer 101 and the second metal layer 1023 are conductively connected by the first conductive pillar layer 1013, the copper pillar layer 1022 and the second conductive pillar layer 1025, step (e), as shown in FIG. 4E.

Figure 4F:
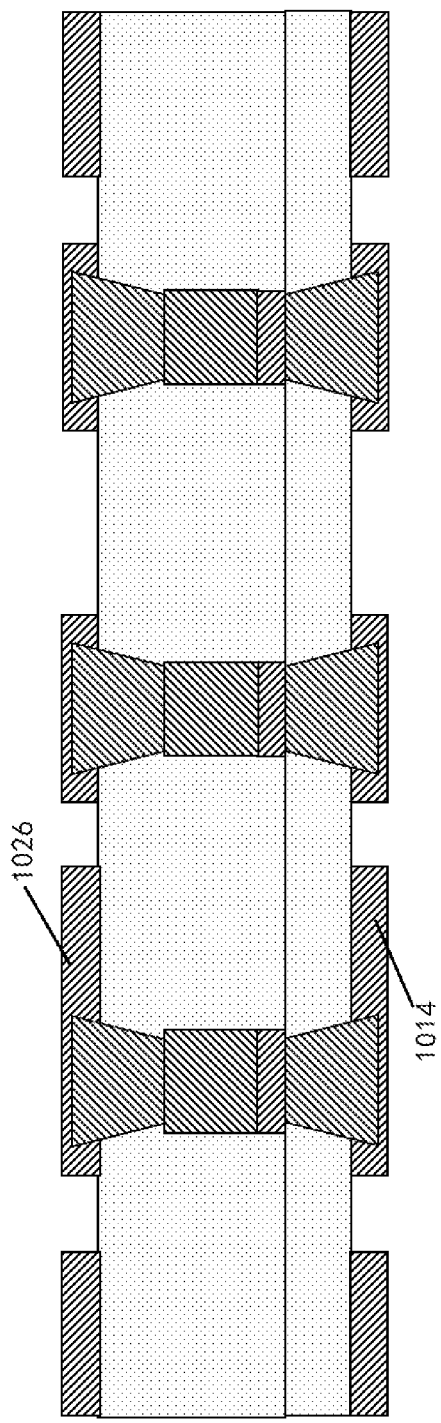

Next, a second photoresist layer and a third photoresist layer are applied on the first metal layer 1011 and the second metal layer 1023, respectively, exposing and developing to form a second feature pattern and a third feature pattern, respectively. The exposed first metal layer 1011 and the second metal layer 1023 are etched in the second feature pattern and the third feature pattern, respectively, to form a first line layer 1014 and a second line layer 1026, removing the second photoresist layer and the third photoresist layer, step (f), as shown in FIG. 4F.

Figure 4G:
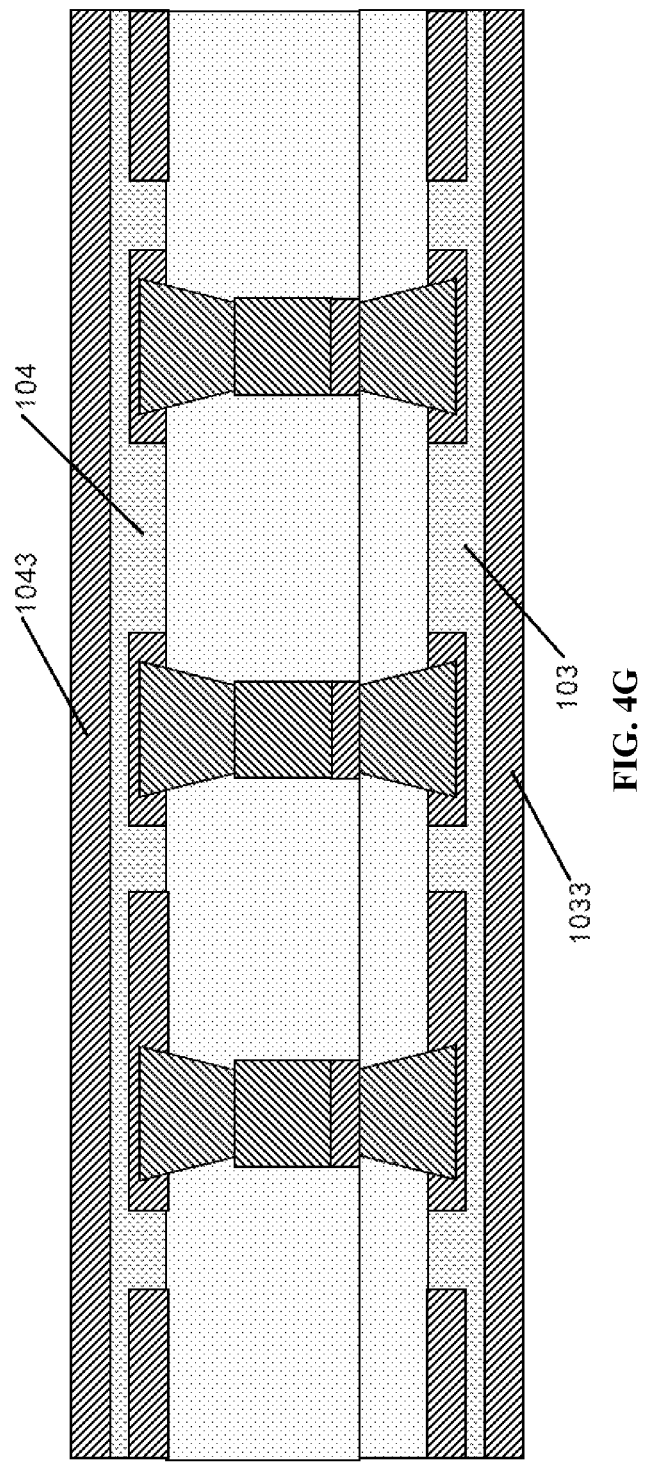

Then, a third dielectric layer 103 is formed on the first line layer 1014. A fourth dielectric layer 104 is formed on the second line layer 1026. A third metal layer 1033 is formed on the third dielectric layer 103. A fourth metal layer 1043 is formed on the fourth dielectric layer 104, step (g), as shown in FIG. 4G.

Figure 4H:
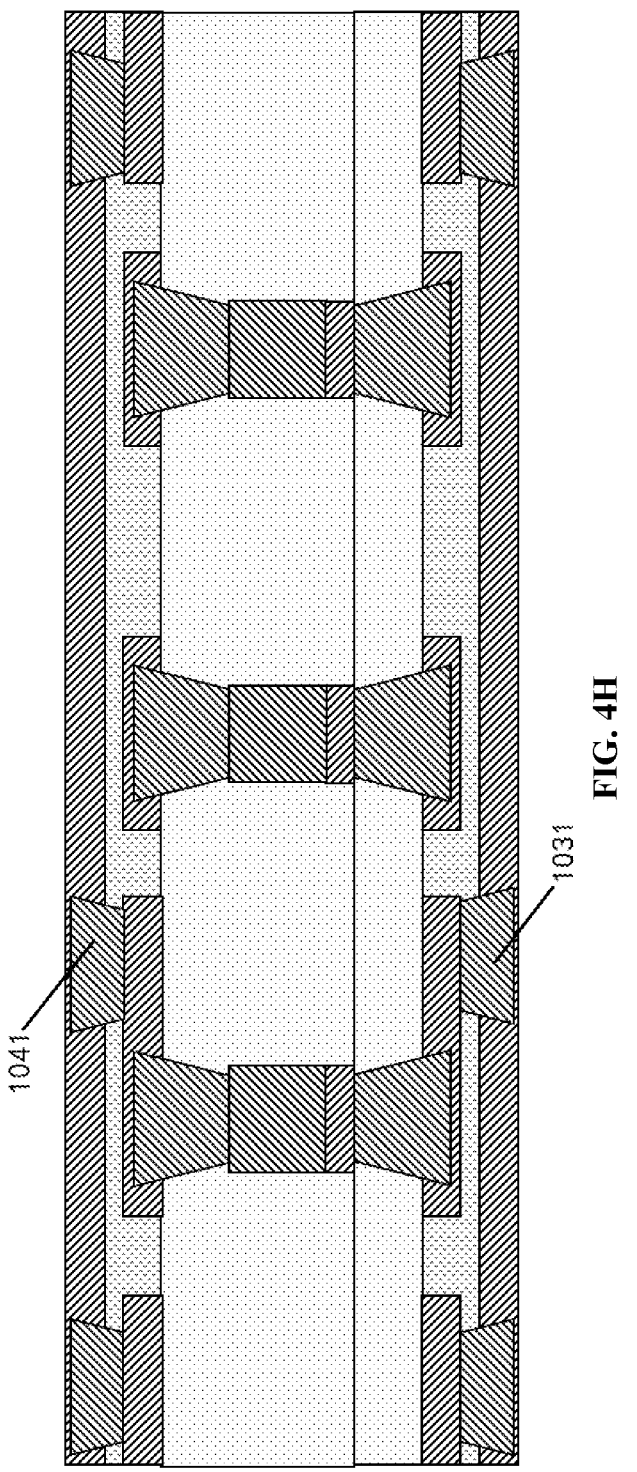

Then, a third via hole 1034 exposing the first line layer 1014 is formed in the third dielectric layer 103, the third via hole 1034 penetrating through the third metal layer 1033. A fourth via hole 1044 exposing the second line layer 1026 is formed in the fourth line layer 104, the fourth via hole 1044 penetrating through the fourth metal layer 1043. The third via hole 1034 and the fourth via hole 1044 are electroplated respectively to form a third conductive pillar layer 1031 and a fourth conductive pillar layer 1041. The first line layer 1014 and the third metal layer 1033 are conductively connected by the third conductive pillar layer 1031. The second line layer 1026 and the fourth metal layer 1043 are conductively connected by the fourth conductive pillar layer 1041, step (h), as shown in FIG. 4H.

Figure 4I:
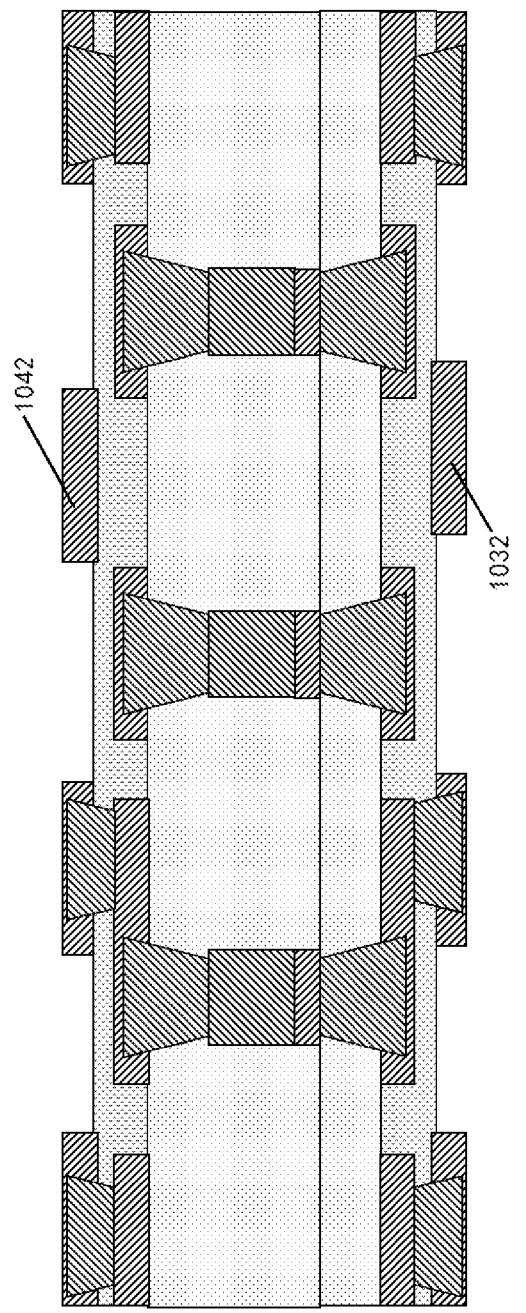

Then, a fourth photoresist layer and a fifth photoresist layer are respectively applied on the third metal layer 1033 and the fourth metal layer 1043, respectively exposing and developing to form a fourth feature pattern and a fifth feature pattern. The exposed third metal layer 1033 and the fourth metal layer 1043 are respectively etched in the fourth feature pattern and the fifth feature pattern to form a third line layer 1032 and a fourth line layer 1042, removing the fourth photoresist layer and the fifth photoresist layer. The first line layer 1014 and the third line layer 1032 are conductively connected by the third conductive pillar layer 1031. The second line layer 1026 and the fourth line layer 1042 are conductively connected by the fourth conductive pillar layer 1041, step (i), as shown in FIG. 4I.

Figure 4J:
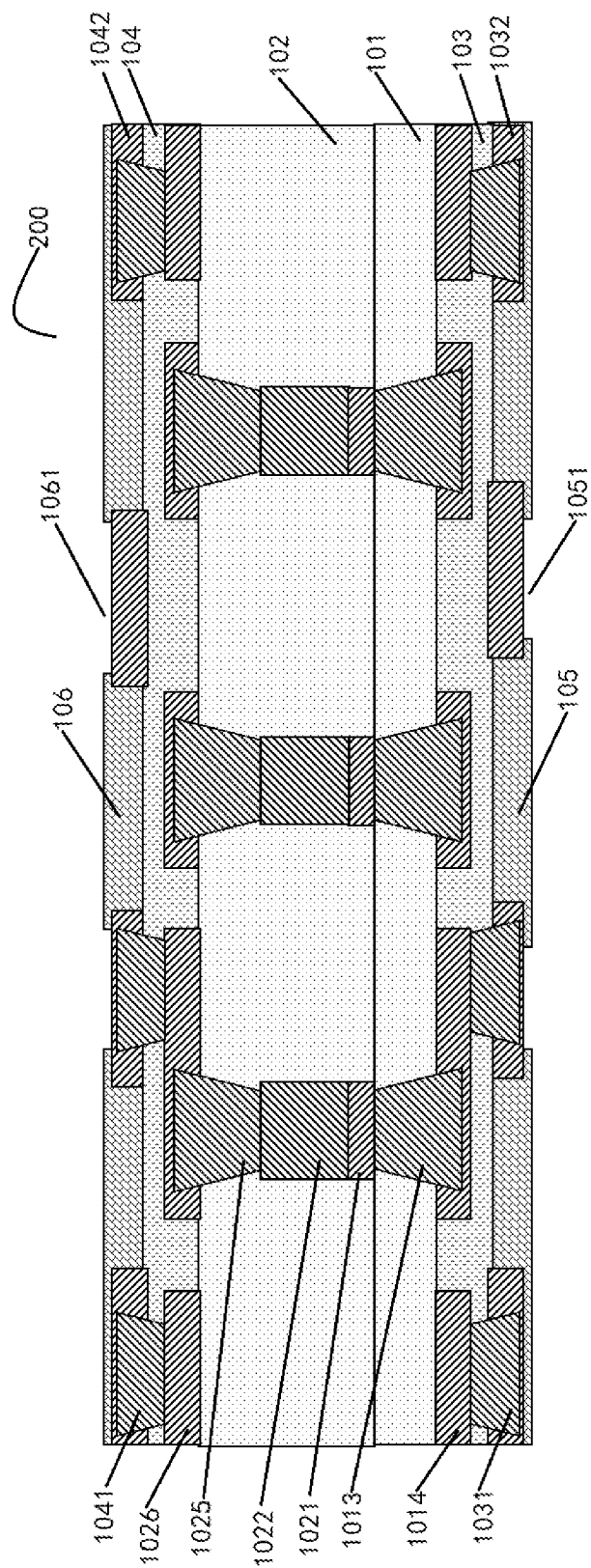

Finally, a first solder mask layer 105 is formed outside the third line layer 1032. A second solder mask layer 106 is formed outside the fourth line layer 1042. A first solder mask opening window 1051 and a second solder mask opening window 1061 are formed in the first solder mask layer 105 and the second solder mask layer 106, respectively, to form a package substrate structure 200, step (j), as shown in FIG. 4J.

It will be appreciated by those skilled in the art that the present invention is not limited by what has been particularly shown and described in context. Rather, the scope of the present invention is defined by the appended claims, including both combinations and subcombinations of the various features described above, as well as variations and modifications thereof. A person skilled in the field will anticipate such combinations, changes, and improvements upon reading the preceding description In the claims, the term "comprise" and variations thereof such as "comprises", "comprising" and the like mean that the recited components are included, but not generally excluding other components.

What is claimed is:

1. A carrier plate for preparing a package substrate, comprising:
   a dielectric layer;
   a seed layer in the dielectric layer; and
   a copper pillar layer on the seed layer,
   wherein a bottom end of the seed layer is higher than a lower surface of the dielectric layer;
   a top end of the copper pillar layer is lower than an upper surface of the dielectric layer; and
   the lower and upper surfaces of the dielectric layer are respectively provided with a first metal layer and a second metal layer,
   wherein the dielectric layer comprises a first dielectric layer and a second dielectric layer arranged in a longitudinal direction;
   an upper surface of the first dielectric layer and a lower surface of the second dielectric layer are adhered;
   the seed layer and the copper pillar layer on the seed layer are provided in the second dielectric layer;
   a lower surface of the seed layer is flush with a lower surface of the second dielectric layer;
   the top end of the copper pillar layer is lower than an upper surface of the second dielectric layer;
   the first metal layer is provided on a lower surface of the first dielectric layer; and
   the second metal layer is provided on the upper surface of the second dielectric layer, wherein a first via hole exposing the seed layer is provided in the first dielectric layer, the first via hole penetrating through the first metal layer; and a second via hole exposing the top end of the copper pillar layer is provided in the second dielectric layer, the second via hole penetrating through the second metal layer.

2. The carrier plate of claim 1, wherein the first metal layer has a same or similar thicknesses with that of the second metal layer.

3. A package substrate structure comprising:
a first dielectric layer and a second dielectric layer arranged along a longitudinal direction,
wherein an upper surface of the first dielectric layer and a lower surface of the second dielectric layer dielectric layer are adhered;
a seed layer, a copper pillar layer on the seed layer and a second conductive pillar layer on the copper pillar layer are provided in the second dielectric layer;
the lower surface of the seed layer is flush with the lower surface of the second dielectric layer;
a first conductive pillar layer is provided in the first dielectric layer, the first conductive pillar layer being in communication with the seed layer;
a first line layer is provided on the lower surface of the first dielectric layer;
a second line layer is provided on an upper surface of the second dielectric layer; and
the first line layer and the second line layer are conductively connected by the first conductive pillar layer, the copper pillar layer and the second conductive pillar layer,
wherein the package substrate structure further comprises a third dielectric layer on the first line layer and a fourth dielectric layer on the second line layer,
wherein a third conductive pillar layer is provided in the third dielectric layer;
a third line layer is provided on a lower surface of the third dielectric layer;
the first line layer and the third line layer are conductively connected by the third conductive pillar layer;
a fourth conductive pillar layer is provided in the fourth dielectric layer;
a fourth line layer is provided on an upper surface of the fourth dielectric layer; and
the second line layer and the fourth line layer are conductively connected by the fourth conductive pillar layer.

4. The package substrate structure according to claim 3, wherein the first dielectric layer and the second dielectric layer are same or different.

5. The package substrate structure according to claim 3, wherein the copper pillar layer comprises at least one copper pillar.

6. The package substrate structure according to claim 3, wherein the conductive pillar layer comprises at least one conductive pillar.

7. The package substrate structure according to claim 3, further comprising a first solder mask layer outside the third line layer and a second solder mask layer outside the fourth line layer; and
a first solder mask opening window and a second solder mask opening window are provided in the first solder mask layer and the second solder mask layer, respectively.

8. A manufacturing method for a package substrate structure, comprising the steps of:

(a) preparing a first dielectric layer, and respectively forming a first metal layer on upper and lower surfaces of the first dielectric layer;
(b) preparing a copper pillar layer on the first metal layer on the upper surface of the first dielectric layer, and etching the first metal layer exposed on the upper surface of the first dielectric layer to form a seed layer;
(c) forming a second dielectric layer on the copper pillar layer, adhering a lower surface of the second dielectric layer and an upper surface of the first dielectric layer, a top end of the copper pillar layer being lower than an upper surface of the second dielectric layer;
(d) forming a second metal layer on the upper surface of the second dielectric layer;
(e) forming a first via hole exposing the seed layer in the first dielectric layer, the first via hole penetrating through the first metal layer, forming a second via hole exposing the top end of the copper pillar layer in the second dielectric layer, the second via hole penetrating through the second metal layer, forming by the seed layer a bottom end of the copper pillar layer, and respectively exposing by the second via hole and the first via hole the top end and the bottom end of the copper pillar layer.

9. The manufacturing method according to claim 8, further comprising:
(f), after step (e), electroplating the first via hole to form a first conductive pillar layer, and electroplating the second via hole to form a second conductive pillar layer, wherein the first metal layer on the lower surface of the first dielectric layer and the second metal layer are conductively connected by the first conductive pillar layer, the copper pillar layer and the second conductive pillar layer.

10. The manufacturing method according to claim 9, further comprising:
(g) after step (f), processing the first metal layer to form a first line layer, and processing the second metal layer to form a second line layer, wherein the first line layer and the second line layer are conductively connected by the first conductive pillar layer, the copper pillar layer and the second conductive pillar layer.

11. The manufacturing method according to claim 10, further comprising:
(h) after step (g), forming a third dielectric layer on the first line layer and a fourth dielectric layer on the second line layer;
(i) forming a third metal layer on the third dielectric layer and a fourth metal layer on the fourth dielectric layer;
(j) forming a third conductive pillar layer in the third dielectric layer, and forming a fourth conductive pillar layer in the fourth dielectric layer, wherein the first line layer and the third metal layer are conductively connected by the third conductive pillar layer, and the second line layer and the fourth metal layer are conductively connected by the fourth conductive pillar layer;
(k) processing the third metal layer to form a third line layer, and processing the fourth metal layer to form a fourth line layer, wherein the first line layer and the third line layer are conductively connected by the third conductive pillar layer, and the second line layer and the fourth line layer are conductively connected by the fourth conductive pillar layer;
(l) forming a first solder mask layer outside the third line layer, forming a second solder mask layer outside the fourth line layer, and forming a first solder mask opening window and a second solder mask opening window respectively in the first solder mask layer and the second solder mask layer.

* * * * *